(12) United States Patent
Massey et al.

(10) Patent No.: US 6,229,208 B1
(45) Date of Patent: May 8, 2001

(54) POSTLESS LARGE MULTICHIP MODULE WITH CERAMIC LID FOR SPACE APPLICATIONS

(75) Inventors: Mary C. Massey, Manhattan Beach; Steven F. VanLiew, El Segundo; Ryan S. Berkely, Long Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/252,535

(22) Filed: Feb. 17, 1999

Related U.S. Application Data

(63) Continuation-in-part of application No. 08/987,859, filed on Dec. 9, 1997, now Pat. No. 6,091,146.

(51) Int. Cl.⁷ .................................................. H01L 23/04
(52) U.S. Cl. ........................ 257/732; 257/704; 257/710; 257/730; 257/731
(58) Field of Search .................................... 257/678, 704, 257/705, 710, 730, 731, 732

(56) References Cited

U.S. PATENT DOCUMENTS

| | | |
|---|---|---|
| 3,538,597 * | 11/1970 | Leinkram et al. ..................... 29/588 |
| 4,356,047 | 10/1982 | Gordon et al. .......................... 156/89 |
| 4,750,665 | 6/1988 | Falanga ................................ 228/123 |
| 4,769,272 | 9/1988 | Byrne et al. .......................... 428/209 |
| 4,833,102 * | 5/1989 | Byrne et al. .......................... 228/121 |
| 4,975,762 | 12/1990 | Sradley et al. ........................ 257/660 |
| 5,477,009 * | 12/1995 | Brendecke et al. ................. 174/52.3 |
| 5,498,900 | 3/1996 | Denaway et al. ..................... 257/659 |
| 6,091,146 * | 7/2000 | Berkely et al. ....................... 257/730 |

FOREIGN PATENT DOCUMENTS 5-267485 * 10/1993 (JP) .
8-64721 * 3/1996 (JP) .

* cited by examiner

Primary Examiner—Olik Chaudhuri
Assistant Examiner—Alonzo Chambliss
(74) Attorney, Agent, or Firm—Michael S. Yatsko; Ronald M. Goldman

(57) ABSTRACT

Large size multi-chip module packages are fitted with a new lid (1) formed of a Kovar™ (5) framed sheet of Alumina (3) no less than 0.04 inches thick to form a new "postless" MCM package 2 (FIG. 4 and FIG. 6) that is tolerant of differential pressures of at least one atmosphere and is reworkable. The rigidity of the Alumina sheet avoids the problem of excess deflection found in the prior lids for the package. It also permits elimination of internal lid support posts, freeing internal area within the MCM package that may be used to seat additional electronic circuitry and/or components.

3 Claims, 5 Drawing Sheets

POSTLESS LARGE MULTICHIP MODULE WITH CERAMIC LID FOR SPACE APPLICATIONS

REFERENCE TO RELATED APPLICATIONS

This application is a continuation-in-part of application Ser. No. 08/987,859 filed on Dec. 9, 1997 U.S. Pat. No. 6,091,146.

FIELD OF THE INVENTION

This invention relates to large hermetically sealed electronic packages and, more particularly, to an improved lid construction for such packages.

BACKGROUND

Two or more semiconductor chips and associated circuits may be assembled together in a single package, referred to as a hybrid or multi-chip module (MCM). The package serves as a protective container for the semiconductor chips, ancillary electrical components, and associated electronic circuits, that are typically supported on a common base. The base generally supports, or consists directly of, a printed circuit element which includes the electrical interconnection paths for the various components and associated connections to the outside of the package.

In order to provide an hermetic seal for the package a lid is generally attached by an appropriate metallurgical bond around the perimeter such that the various components are enclosed within. A seal ring is typically incorporated in the package base to facilitate forming the metallugical bond to the lid. This seal ring may take various forms such as metal side walls on a metal package, a metallized ring surrounding the enclosed component area on a ceramic package, or a separate raised metal ring metallurgically bonded to a ceramic package.

A desirable feature of MCM packages is that they be "reworkable", in the event one or more of the semiconductor devices in the MCM fail, and require replacement. Whereas an individually packaged semiconductor chip cannot be repaired and if it fails is simply discarded, it is not economical to discard an entire MCM should one of its many semiconductor chips fail. Thus it is desirable that the MCM package be sealed in such a manner that it is possible to remove the lid, remove and replace the failed device(s), and thereafter replace the lid and reseal the package.

In certain instances benefits such as size, weight, and power reductions, and improved electrical performance of an electronic device may be realized by increasing the overall size of MCM packages to envelope a greater number of circuit elements, elements that would otherwise be housed in separate packages. As the length or width dimensions of the associated large MCM lids are driven beyond about 2 inches, forces on the package lids can become problematic.

Significant forces on large hermetic MCM lids arise as a result of differential pressure between the inside and outside of the package. As example, such pressure differential occurs during post-seal leak testing when an external overpressure is used to drive a detectable leak tagging gas into the package and also occurs later when high altitude or space applications reduce the external ambient pressure to levels far below the gas pressure entrapped within the package's interior.

Such large forces tend to deflect the lid inward, possibly contacting and damaging enclosed components, or outward, where undesirable contact may occur with structure or other parts located in close proximity to the package. In addition to the possibility of such undesirable physical contact, the deflection creates large forces on the metallurgical bond between the lid and seal ring, enough to exceed elastic stress limits, with an associated tendency to lose hermeticity.

It may be shown by approximating a section of the lid with beam equations that lid deflection is proportional to $PL^4/t^3$, where P is differential pressure, L is the unsupported beam length, and t is the beam thickness. From this it may be appreciated that lid deflection for a 2.5 inch span is approximately 2.6 times that of a 2.0 inch span. It may also be recognized that to minimize deflection simply by increasing lid thickness, the lid thickness must increase geometrically relative to the increase in span. For large MCMs, this leads to prohibitively heavy lids, especially for avionics and spacecraft applications.

Other solutions have been offered to protect internal components from inward deflection, and the seal from large stresses, but each solution poses an offsetting disadvantage. Internal support posts or other intermediate internal supports, upstanding from the base, have been used to buttress and strengthen the lid. However, those posts and other supports require space within the package reducing the area available for component placement and routing. And with reduced space, another package might be required to house a complete electronic circuit.

Others have recently identified and publicized the foregoing problems in an article entitled "Lid Deflection for MCMs in Airborne Application", Huey et al., ICEMCM '96 Proceedings of the 1996 EHM Conference on Multichip Modules, Apr. 7, 1996, pp. 167–172, which the reader is invited to review. In that article, the authors recognize the foregoing solutions and explore the disadvantages of those solutions at greater length than here. The solution the article's authors think best is to hermetically seal the MCM at a lower gas pressure of one-half atmosphere, instead of the normal one atmosphere pressure. The present invention also seeks to ensure continued integrity of the lid in such high pressure differential situations and offers a different and better solution than proposed in that article.

With hindsight, one seeking cure to the pressure differential based deflection problem might first briefly think to make reference for same to the individual semiconductor packaging art, that is, the packaging semiconductors individually, and quickly dismiss the thought.

As is well recognized, a semiconductor chip is a physically small device, perhaps no greater in size than one-quarter to one-half inch square. One such chip package is known as the ceramic side brazed dual in-line package. The package, that is the base, is formed of ceramic material, is of rectangular shape, a Kovar™ metal seal ring forms a rectangular wall of short height on the base enclosing the semiconductor, and two rows of metal pins are brazed to the edges of the base, providing terminals for connection to other electrical circuits. And means are included for connecting the installed semiconductor device's bonding pads to metal pathways incorporated into the package that connect to those metal pins. The semiconductor package is also hermetically sealed by welding or soldering a closure lid atop the seal ring. The closure lids for those packages are formed either of a compatible metal such as Kovar™, or of the same ceramic material that forms the package. Thus the package for the smaller individual chips are recognized to share a generic similarity with the physically much larger MCMs.

The reader is reminded that, notwithstanding the fact that the package seal ring and/or lid is formed of a metal alloy, MCM individual chip packages are generally referred to by technicians in the industry as ceramic packages, however imprecise that reference may be, so long as the package contains a base that is formed of ceramic material.

In looking to the individual chip packaging art, however, one is quickly reminded that reworkability is not a requirement for those semiconductor packages as it is for MCM. The devices cannot be reworked. If a semiconductor chip fails to perform, it is simply discarded and replaced by a like component. If it fails in operation in a circuit, the package is unsoldered from its place on the printed circuit board and is replaced with another like chip.

As stated by Byrne in U.S. Pat. No. 4,769,272, a patent that describes a ceramic package for an individual chip, and alluded to in his divisional U.S. Pat. No. 4,833,102, metal lids, such as nickel/iron alloy lids, can be "popped off" a ceramic package, viewed in the single chip package art as a disadvantage, but the ceramic lids cannot. To effect removal of a sealed ceramic lid, according to Byrne, the lid ordinarily must be fractured and removed in pieces. Hence, putting higher cost of the ceramic aside, the ceramic lid is believed more reliable than the Kovar™ for packaging individual semiconductor chips because it is permanent and cannot be reworked.

Were the lack of reworkability taught by Bryne not discouragement enough, one also finds that no one in that art appears to address a problem of excess lid deflection. As example, faced with manufacturing difficulties of high volume production, in U.S. Pat. No. 4,356,047, Gordon finds that bare wires used to bond the connection sites of a semiconductor chip to the circuit board in an individual chip package, could contact the gold plating on the Kovar™ lid, if misrouted during assembly, and short-circuit the chip, which must be discarded, thereby lowering production yield. Gordon proposes use of ceramic, a non-conductor, for the lid material and solders the ceramic lid to the seal ring.

Further, in U.S. Pat. No. 4,750,665, Falanga finds that a Kovar™ lid corrodes when exposed to salt air or other corrosive atmosphere and substitutes a ceramic sheet supported by a solder wettable metal frame that is soldered to the package's seal ring.

Then, Stradley U.S. Pat. No. 4,975,762 who employs a ceramic lid for an individual chip package, as suggested by Gordon, but incurs problems due to the existence of alpha particles generated naturally by Thorium and/or Uranium impurities within the ceramic used. The alpha particles could shower the semiconductor and cause mis-operation, referred to as "soft errors". To prevent that Gordon requires the addition of an alpha particle blocking layer to the ceramic. Stradley suggests that the cure to one problem often engenders other problems.

And then, in U.S. Pat. No. 5,498,900, Dunaway, who exposes his packaged chips to high energy particles, such as X-radiation, finds gold plated Kovar™ lids liberate and shower the packaged semiconductor chip with electrons, and that those X-rays can produce thermal mechanical shock of the solder bonding the ceramic lids in the package. To avoid that damage Dunaway substitutes a metal framed ceramic sheet for the Kovar™ lid, and connects the sheet to the frame and the frame to the seal ring with a solder free welded bond.

Reviewed in hindsight the foregoing chip packaging art addresses a litany of problems, but none of that prior art appears to address a problem with excess lid deflection.

As a lay person recognizes from experience, pushing down on the middle of a metal soda pop bottle cap, while the cap is in place on the bottle, produces indiscernible deflection of the cap's surface. But, pushing down on the middle of the large diameter lid of a can of tomato's with the same force, produces discernable deflection, even though the thickness of the can's lid is greater than that of the corresponding surface of the bottle cap. The diameter of the tomato can lid being much larger, because of the greater distance of the pressing force to the supporting edges, one obtains a greater mechanical advantage and pushing down on the tomato can's lid thereby produces deflection.

Experience teaches that it is not worthwhile to try to deflect the bottle cap surface and any thought of attempting to do so no longer comes to mind. But the tomato can be a sort of toy noisemaker, sometimes producing a popping sound that gives momentary amusement. Those skilled in the art will recognize the same distinction between the small sized lids used in packages for individual semiconductors and the much larger lids required for large multi-chip modules, those having length or width greater than about 2 inches. The individual chip packaging structures thus appears to lack relevance to a cure to the MCM deflection problem. One having the deflection problem with MCM package lids, is thereby led to continue research to uncover a solution. As an advantage the present invention provides a solution to undesired deflection. As an incidental advantage, the present invention frees additional regions within the module by elimination of any necessity for the internal support posts that were previously used to support the module's lid.

Accordingly, an object of the present invention is to provide a lid for large MCM's that does not significantly deflect when subjected to large differential pressures.

Another object of the invention is to provide a new lid for a MCM package that does not require a change in the physical dimensions of the MCM package and/or the addition of stiffening posts to avoid excessive lid deflection when the MCM package is subjected to large stresses created by large pressure differentials existing between the gas atmosphere internal of the package and that on the exterior.

A further object of the invention is to provide an improved multi-chip module package that withstands large pressure differentials without encountering significant elastic lid deformation and which is reworkable.

A still further object of the invention is to provide a "postless" multi-chip module package that is reworkable and withstands large pressure differentials without encountering significant elastic lid deformation and does not require internal support posts.

And an ancillary object of the invention is to maximize space available to mount chips and other components within an MCM module by eliminating space reducing support posts.

SUMMARY OF THE INVENTION

A physical characteristic of alumina, not expressed by the referenced literature but perhaps implicit in actual individual chip packages, is that as a solid body, alumina is extremely rigid; about five times as rigid as Kovar™ per unit weight. As applicants have discovered, slabs of Alumina of the large areas required for large MCM's, two inches and larger in dimension, do not bend or deflect excessively when subjected to large pressure differentials, both positive or negative. Any deflection is minimal.

Accordingly, in accordance with the foregoing objects, a lid for an MCM package is formed principally of alumina in a size of four square inches or larger and in a thickness of no less than 0.04 inches. The lid includes a stepped rim formed of Kovar™ that is brazed to the alumina with a copper-silver braze material. The foregoing lid takes advantage of existing MCM package base designs and permits the lid to be welded to the base by traditional methods, allowing the package to be re-worked.

The new lid has significantly less deflection. It is relatively simple to manufacture. Given the advantage of hindsight and in retrospect, the foregoing improvement in MCM packaging with its new lid structure bares likeness to the alternative lid structures employed for some individual chip packages with which the new lid might in retrospect be compared, and comes about for a reason entirely different from that underlying use in the individual chip packages.

As an advantage the foregoing lid resists significant deflection, both outward directed pressure, where the pressure inside the hermetically sealed MCM package exceeds the external ambient, and inward pressure, where the ambient pressure exceeds the pressure inside the package, as would cause a conventional lid to bow inward significantly.

And in combination with the other components of the MCM package, the new lid provides a new and improved MCM package. As a further advantage the new MCM modules constructed with the lid are "postless". That is, they do not require or contain any internal posts, as found in the prior art, that are mounted within the package on the component circuit board to support the lid and prevent inward bowing under negative pressure.

The elimination of those posts frees additional substrate "real estate", that may be employed to mount electrical components and/or semiconductor chips, permitting larger sized chips and/or additional electronic circuits to be packed within a defined area and avoiding the necessity for designing and manufacturing MCM packages of greater size as would otherwise be necessary to accommodate the larger chips and/or additional circuits. As the MCM's are required to perform more and more tasks, and be evermore sophisticated and complex, which is the modern trend, larger sized chips and greater numbers of associated electronic components are required and must be packaged within a module. In short, in realizing additional packaging space, the new MCM package helps to contain the cost of MCM module manufacture and minimizes space requirements for the motherboard on which the module is placed.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DETAILED DESCRIPTION OF A PREFERRED EMBODIMENT

Figure 1:
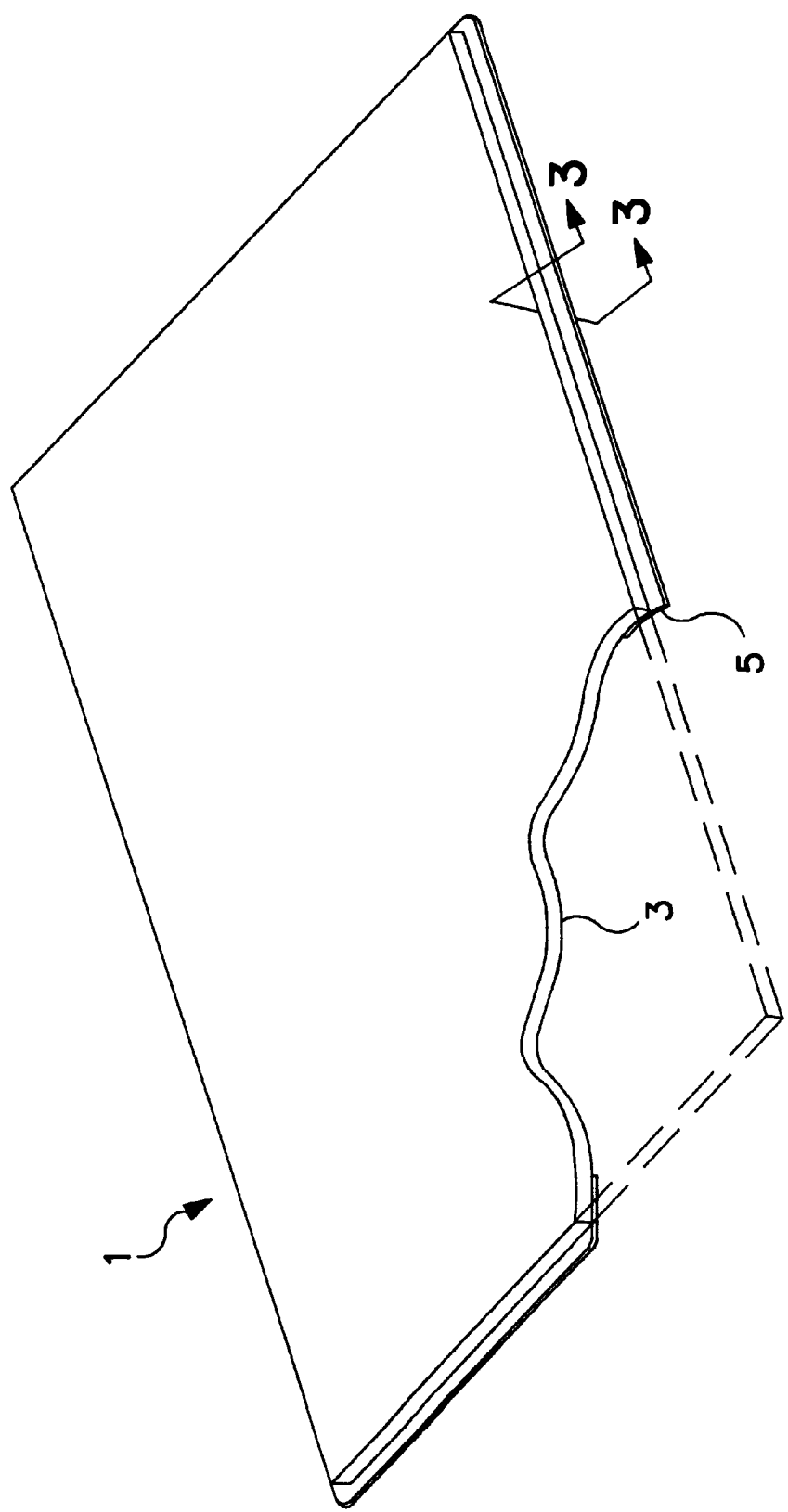
FIG. 1 illustrates an embodiment of the MCM lid.

A lid 1 constructed in accordance with the invention is illustrated in a partial top perspective view in FIG. 1, with one of the corners, represented by dash lines, being cut away for purposes of illustration. Lid 1 is constructed of a thin flat rectangular sheet 3 of aluminum oxide, alumina, an electrical ceramic insulator that in physical characteristic is very hard, relatively lightweight and stiff. Alumina sheet 3 overlies and is attached along its outer edges to a stepped rectangular shaped metal frame 5, that is formed of a nickel-iron alloy such as Kovar™, and may be plated with nickel and/or gold. As illustrated, the metal frame is slightly greater in its length and width dimensions than the alumina sheet so as to protrude beyond the flat sheet's edges on all four sides, and the frame's width is sufficiently large so as to allow a portion of the frame's rim to overlap the underside edges of alumina sheet 3 and provide the latter support, while providing a large central open area or window.

Figure 2:
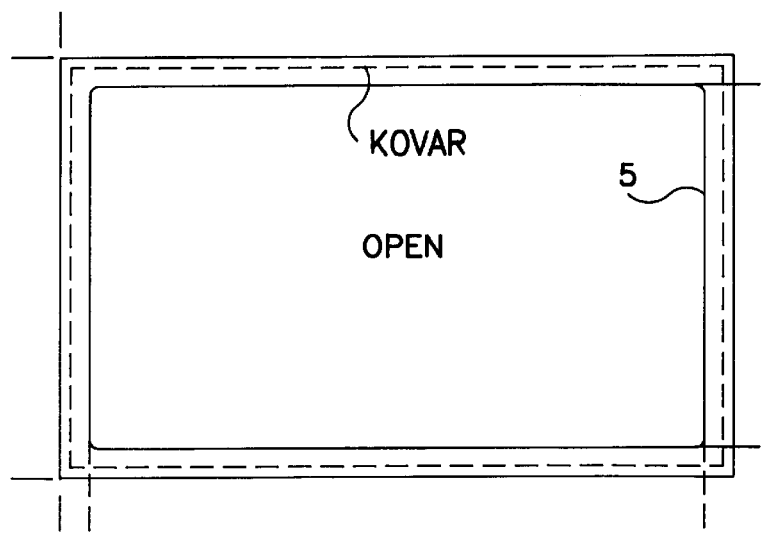
FIG. 2 illustrates a top plan view of the frame for the lid of FIG. 1.

A separate top plan view of frame 5 is illustrated in FIG. 2. The dash line in that figure is included to indicate the position of the outermost edges of the alumina sheet 3 overlapped by the frame.

Figure 3A:
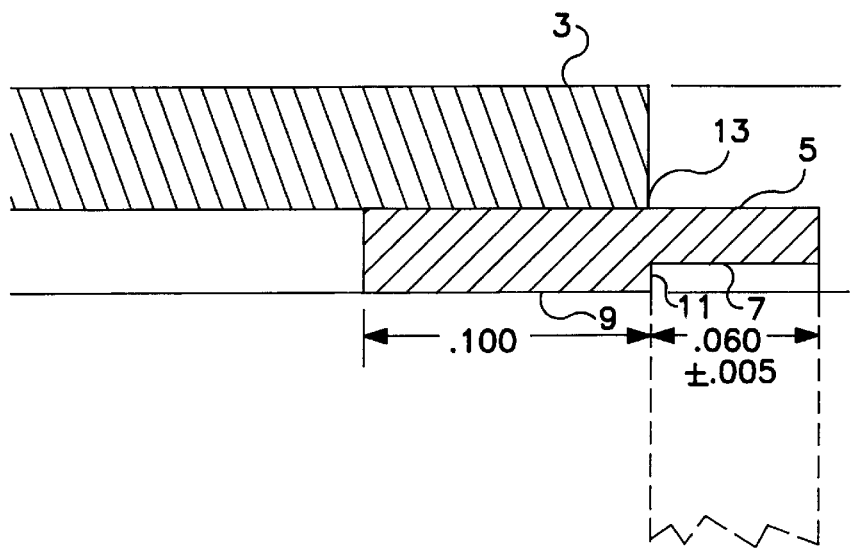
FIG. 3A is a partial section view of a side edge of the lid of FIG. 1.

An enlarged partial cross section view of the lid, taken along the lines 3—3 in FIG. 1, is illustrated in greater scale in FIG. 3A to which reference is made. As more clearly shown in this figure the underside surface of the frame is stepped. A portion of the frame's bottom surface 7 is stepped up or recessed from the remaining bottom surface portion 9, with a vertical "riser" surface 11 between the two surface portions.

Figure 4:
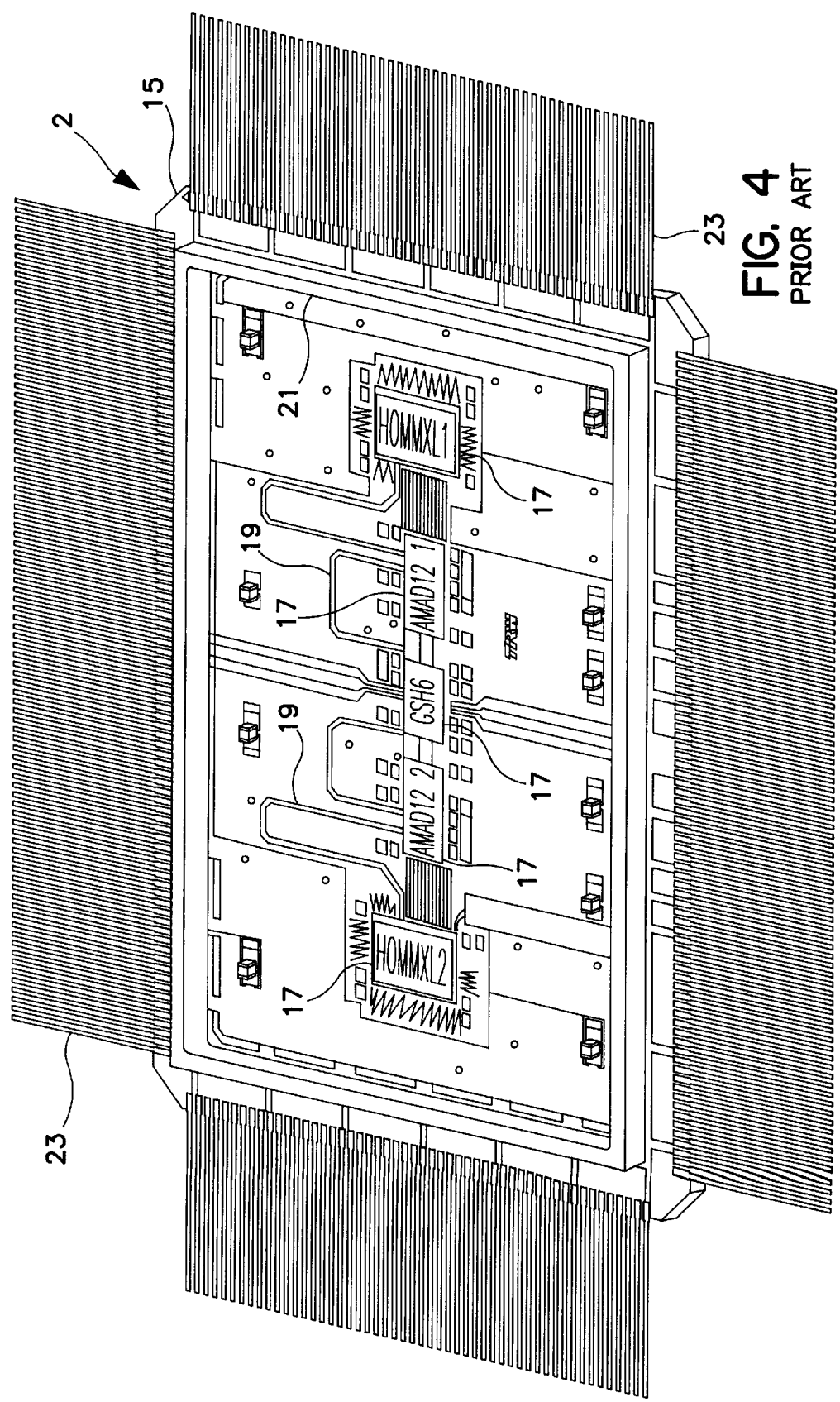
FIG. 4 illustrates a prior art MCM package base elements, including an illustration of semiconductor chips and related electronic components, used with the lid of FIG. 1 to form the package for the MCM.

The width of stepped portion 7 is designed to fit the width of the top of the upstanding ring frame of the MCM package, the latter illustrated by dash lines, and such as illustrated in FIG. 4, later herein described. The riser helps to align the lid to that package side wall and allows the lid to be more easily set in place. The upper inner surface peripherally bordering frame 5 serves as an upper flange and supports sheet 3 along its bottom peripheral edges. Frame 5 is attached to alumina sheet 3, preferably, using a copper-silver or similar braze material 13.

Figure 3B:
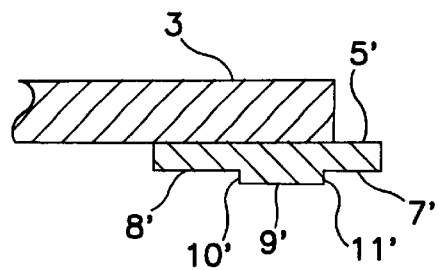
FIG. 3B is a partial section view of an alternative side edge for the lid of FIG. 1.

Variations in the foregoing edge structure are permissible. As example, FIG. 3B is a partial cross section view of an alternative lid edge structure, corresponding to the view of FIG. 3A, drawn in a smaller scale. For convenience the elements in this figure are identified by the same numbers used for the corresponding elements in the preceding figure and are primed. Here the bottom surface portion 9' is more narrow than in the preceding embodiment. Portions of the frames's bottom surface 7' and 8' on each side of bottom surface 9' is stepped up or recessed from that bottom surface with respective vertical "riser" surfaces 11' and 10' between the two surface portions. In other respects including attachment to the ceramic portion 3, this alternative structure is the same as that described for FIGS. 1–3.

Figure 6:
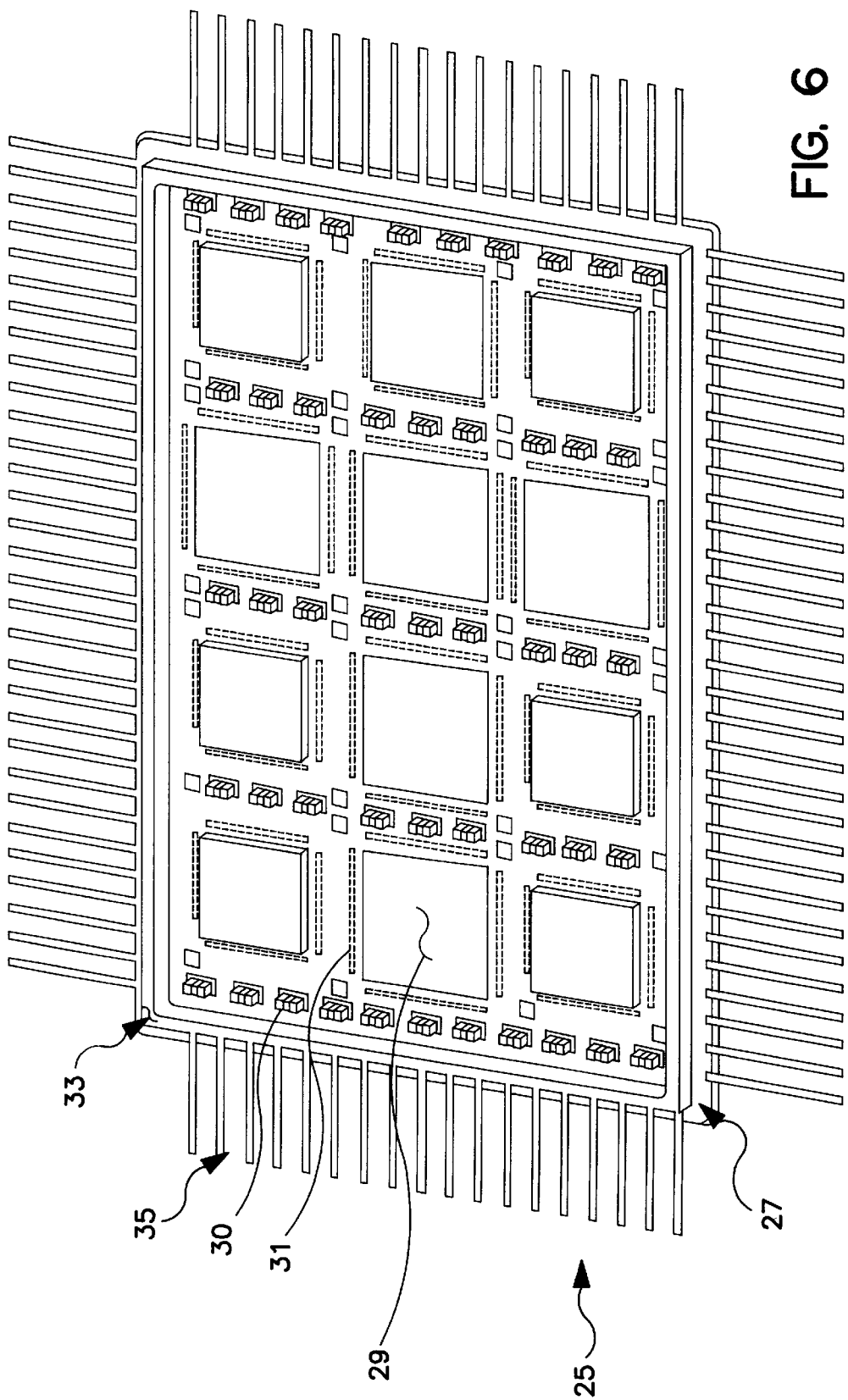
FIG. 6 illustrates, not to scale, a new MCM package base elements, including an illustration of the densely packed semiconductor chips and electronic components, used with the lid of FIG. 1 to form the package.

FIGS. 4 and 6 illustrate two different MCM packages with the lids omitted, both of which are reworkable and avoid a significant lid deflection under large pressure differentials. The former includes chips in a circuit arrangement that does not require use of all available interior space, and the latter containing another circuit arrangement that is densely packed in the available space. FIG. 4, considered first, illustrates a Multi-Chip Module package 2 in a top perspective view not drawn to scale with the lid 1 of FIG. 1 removed. It represents the portion of the MCM package that is the same as found in the prior art. The circuit elements are presented to show positioning and mechanical configuration principally of the packaging elements and the relationship of the elements to lid 1. It is appreciated further that the elements on the MCM in FIG. 4 are not intended to represent any specific electronic device, as the structure and function of any such electronic devices are not material to the present invention and do not assist in its understanding.

As an example of one common type of MCM package construction, the package's base 15 is formed of multi-layer ceramic and comprises a flat multilayer ceramic substrate, akin to a printed circuit board, the latter term connoting in this art an inferior material, such as glass epoxy. The base supports two or more semiconductor chips 17 on its upper surface, as well as plated on pattern of electrical conductors 19. A shallow upwardly extending rectangular shaped metal wall 21, formed of Kovar™, in the geometry of a rectangle or closed loop, referred to as a seal ring, is hermetically sealed to and permanently attached to base 15, suitably being brazed in place using conventional brazing material and technique to form a hermetic seal.

The Kovar™ seal ring surrounds the semiconductors and related electronic components of the electronic circuit disposed in the module and generally defines the height of a well or receptacle region for those electronic elements, which, ultimately, are hermetically sealed with lid 1 in place atop the Kovar™ seal ring. Further, the Kovar™ seal ring is slightly shorter in length and width dimension than the corresponding dimensions of base 15 and thereby proscribes a predefined smaller area of the larger sized area of the base, leaving exposed edges exterior of the wall on all four sides of the base to which parallel rows of straight metal conductors or terminals 23 are attached.

Figure 5:
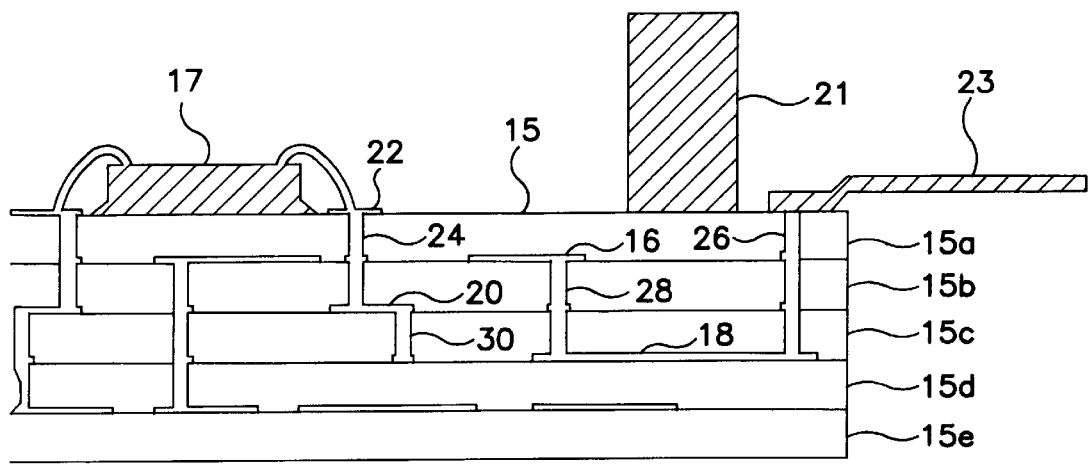
FIG. 5 is an enlarged not-to-scale partial section view of a portion of the prior art elements of FIG. 4.

The semiconductor chips are epoxied or soldered to bonding pads on the ceramic substrate/base 15. Some of these bonding pads connect to electrical "vias" in the ceramic printed circuit board, which, as is known, are conductors that extend vertically, along the bases height direction. The via element is better represented in FIG. 5 to which reference is made. As illustrated by a greatly enlarged partial section view of a portion of a multilayer circuit board and, by way of example, the ceramic substrate 15 is formed of multiple layers bonded together, 15a–15e, five being illustrated. Some or all of those layers may contain patterns of electrical conductors, such as represented, as example at 16, 18, 20 and 22. They also contain vias, as example 24, 26, 28 and 30, the vertically extending conductors "solid-filled" holes through the layer, which interconnect the patterns on one surface with that on another, as example, to form a completed electronic circuit.

As example in this figure vias 24, comprising two vertically aligned vias on separate layer levels, connect a bonding pad 22 on the surface to other electrical circuits on the board and/or connect to a bonding pad at one of the terminals 23 that is located outside the Kovar™ seal ring 21. This also illustrates the path taken to connect the internal circuits to the external terminal 23, as example, via circuit 16, via 28, circuit 18 and via 26, which defines a path under the Kovar™ side wall 21 to a bonding pad. Electrical terminal 23 is welded to the latter bonding pad.

Returning to FIG. 4, to complete the MCM, lid 1 is set in place on top of Kovar™ seal ring 21 and the peripheral edge of the protruding portion of frame 5 and its bottom surface portion 7 are metallurgically joined to the ring seal. This hermetically seals the package. It is seen that the lid is supported solely about its peripheral edge solely by the ring seal. The substrate does not contain any support posts to shore up or hold onto the central sections of the lid. In its application, the MCM is disposed within another printed circuit board, a mother board, not illustrated, which may also contain one or more additional components, and the external leads or terminals 23 interconnect to corresponding leads on that mother board to complete the desired electrical circuit.

Next, FIG. 6 illustrates a Multi-Chip Module package 25 in a top perspective view, not drawn to scale, with the lid 1 of FIG. 1 removed and is the lower portion of the MCM package. As shown this package is more fully utilized and benefits from the new "postless" design. The package is illustrated stuffed with the base, a multi-layer alumina substrate 27, and the semiconductor chips 29 and other electronic components 30 mounted to that circuit board.

It should be appreciated, however, that, as in the prior embodiment, the electronic elements shown installed within MCM 25 in FIG. 6 are not intended to represent any specific electronic device, as the structure and function of any such electronic devices are not material to the present invention and do not assist in its understanding. They are presented principally to show the mechanical configuration in relation to the packaging elements and the relationship of the elements to lid 1.

The package's base 27 is formed of multi-layer ceramic and comprises a flat multilayer ceramic substrate. The base supports twelve semiconductor chips 29 on its upper surface, only one of which is labeled, a large number of smaller size electronic components 30, as well as plated on pattern of electrical conductors 31. A shallow upwardly extending rectangular shaped metal wall 33, formed of Kovar™, in the geometry of a rectangle or closed loop, referred to as a seal ring, is hermetically sealed to and permanently attached to base 27, suitably being brazed in place using conventional brazing material and technique to form a hermetic seal.

As in the prior embodiment of FIG. 4, the Kovar™ seal ring surrounds or walls in the semiconductors and related electronic components of the electronic circuit disposed in the module and generally defines the height of a well or receptacle region for those electronic elements, which, ultimately, are hermetically sealed with lid 1 in place atop the Kovar™ seal ring. Further, the Kovar™ seal ring is slightly shorter in length and width dimension than the corresponding dimensions of base 27 and thereby proscribes a predefined smaller area of the larger sized area of the base, leaving exposed edges exterior of the wall on all four sides of the base to which parallel rows of straight metal conductors or terminals 35 are attached.

Semiconductor chips 29 are epoxied or soldered to the bonding pads on base 27. As is conventional and as earlier described in connection with FIGS. 4 and 5, some of these bonding pads connect to electrical "vias" in the multi-layer ceramic substrate or base and from there extends to other circuits defined by the printed wiring on any of the various layers on the substrate and/or from either the former or the latter connect through to other portions of the printed wiring and/or various input-output contacts or leads 35 that extend laterally out the four sides of the rectangular package. More specifically, the plated-on electrical wiring within the region defined by the metallic solder ring wall 33 extends under the wall to respective bonding pads, not illustrated, formed on the edges of substrate 27 exterior of the wall and the electrical terminals 35 are welded to respective ones of those bonding pads. In as much as the vias and other plated-on wiring or traces and bonding pads in the multilayer substrate, electrical contacts or leads 35, and their attachment to substrate 27 are conventional and known to those skilled in the art, and have already been described in connection with FIGS. 4 and 5, it is not necessary to repeat that description.

To complete the MCM package 25, lid 1 (FIG. 1) is set in place on top of Kovar™ seal ring 33 and the peripheral edge of the protruding portion of frame 5 and its bottom surface portion 7 are metallurgically joined to the ring seal 33. This hermetically seals the MCM package. The lid is supported solely about its peripheral edge solely by ring seal 33. No posts are other support members are required to prevent the lid from bending out under a negative pressure differential or from bending inwardly, where it could contact a component, under a positive pressure differential. In its application, the MCM is disposed within another printed circuit board, a mother board, not illustrated, which may also contain one or more additional components, and the external leads or terminals 35 interconnect to corresponding leads on that mother board to complete the desired electrical circuit.

In one specific example a large MCM package having a lid area of ten square inches was constructed with an alumina ceramic lid that was 60 mils thick. The package successfully passed the foregoing deflection tests, was space qualified, and was reworkable.

Hermetic lids for large MCM's for avionics or spacecraft application require special design considerations relating to differential pressure: External overpressure during preconditioning for leak testing, and reduced external pressure at high altitude or in space. Under either of such differential pressures, positive or negative, it is found that the new lid has minimum distortion and produces insignificant deflection.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. A lid for hermetically sealing a large multi-chip module package, said large multi-chip module package having an area requiring a covering lid to cover at least four square inches in area and in which at least one of the length and width dimensions defining said area is at least two inches in length, comprising:

a thin self supporting metal framed flat sheet of alumina, said metal framed flat sheet being of a sufficient area to cover the exposed area of said large multi-chip module package and sufficient in rigidity to withstand at least one atmosphere of differential pressure without significant surface deflection, wherein said thin self supporting metal framed flat sheet of alumina, comprises: a thin flat sheet of alumina, said sheet having an upper surface and a lower surface;

a metal frame for supporting said thin flat sheet about its peripheral edges, said metal frame including:

a first flange surface on a upper side of said metal frame hermetically sealed to said thin flat sheet for supporting said flat sheet about said peripheral edges, said first flange surface including a layer of metal-to-ceramic brazing material;

a second flange surface on a lower side of said metal frame and extending peripherally about the outer edges of said metal frame for hermetically sealing said metal frame to a ring seal in said multi-chip module package;

a bottom surface on said lower side of said metal frame stepped in position below said second flange surface to protrude within said ring seal in said multi-chip module package when said metal frame is hermetically sealed to said ring seal; and a riser surface between said second flange surface and said bottom surface for defining a riser extending in a loop about the underside of said metal frame for laterally orienting said lid with respect to said ring seal.

2. The invention as defined in claim 1, wherein said metal comprises the material Kovar.

3. The invention as defined in claim 2, wherein said metal further comprises a layer of nickel overlying said Kovar and a layer of gold overlying said layer of nickel.

* * * * *